US008330449B2

(12) United States Patent  (10) Patent No.: US 8,330,449 B2
Greenberg  (45) Date of Patent: Dec. 11, 2012

(54) CLAMP-ON MULTIMETERS INCLUDING A ROGOWSKI COIL FOR MEASURING ALTERNATING CURRENT IN A CONDUCTOR

(75) Inventor: Robert M. Greenberg, Marysville, WA (US)

(73) Assignee: Fluke Corporation, Everett, WA (US)

( * ) Notice: Subject to any disclaimer, the term of this patent is extended or adjusted under 35 U.S.C. 154(b) by 527 days.

(21) Appl. No.: 12/506,118

(22) Filed: Jul. 20, 2009

(65) Prior Publication Data

US 2011/0012589 A1 Jan. 20, 2011

(51) Int. Cl.
*G01R 15/18* (2006.01)
*G01R 1/38* (2006.01)

(52) U.S. Cl. .......................... 324/127; 324/126; 324/115

(58) Field of Classification Search .......................... None
See application file for complete search history.

(56) References Cited

U.S. PATENT DOCUMENTS

| | | | | |
|---|---|---|---|---|
| 3,323,056 A | * | 5/1967 | Haley | 324/117 R |
| 4,723,220 A | * | 2/1988 | Smith-Vaniz | 702/62 |
| 4,831,327 A | * | 5/1989 | Chenier et al. | 324/127 |
| 5,349,289 A | * | 9/1994 | Shirai | 324/127 |
| 5,825,175 A | * | 10/1998 | Selcuk | 324/117 H |
| 6,366,076 B1 | * | 4/2002 | Karrer et al. | 324/117 R |
| 2009/0058399 A1 | | 3/2009 | Wang et al. | |
| 2011/0012587 A1 | * | 1/2011 | Greenberg | 324/114 |

OTHER PUBLICATIONS

Chinese Patent Application No. 201010231489.5, Office Action, 23 pages, Apr. 20, 2012.

* cited by examiner

*Primary Examiner* — Vinh Nguyen
(74) *Attorney, Agent, or Firm* — Perkins Coie LLP

(57) ABSTRACT

A clamp-on multimeter measures alternating current flow in an electrical conductor. The multimeter includes a display, a housing including the display, a first sensor, a second sensor, a processor and an integrator. The first sensor has a magnetizable material core and inductively senses the alternating current. The first sensor includes a first clamp portion fixed to the housing and a second clamp portion pivotally coupled to the first clamp portion. The second sensor includes a Rogowski coil that has a non-magnetic core and inductively senses the alternating current. The processor receives an input signal in a first voltage range and sends an output signal to the digital display. The integrator scales a signal from the second sensor in a second voltage range to the first voltage range. The housing includes the processor, the integrator, and a selector configured to select the input signal to the processor from one of the first sensor and the integrator.

17 Claims, 3 Drawing Sheets

CLAMP-ON MULTIMETERS INCLUDING A ROGOWSKI COIL FOR MEASURING ALTERNATING CURRENT IN A CONDUCTOR

TECHNICAL FIELD

The present disclosure relates generally to electronic test instruments for measuring alternating current flow in an electrical conductor of an electrical circuit. More particularly, the present disclosure relates to a multimeter having two different sensors for measuring current without breaking the circuit.

BACKGROUND

Multimeters, also called digital multimeters or "DMMs", are adapted for measuring a number of parameters generally needed for service, troubleshooting, and maintenance applications. Such parameters typically include a.c. (alternating current) voltage and current, d.c. (direct current) voltage and current, and resistance or continuity. Other parameters such as frequency, capacitance, and temperature may also be measured to meet the requirements of the particular application. In order to measure current with a general purpose multimeter, an internal current shunt having a known resistance must be inserted in the current path, requiring a break in the current-carrying conductor. The voltage drop across the current shunt is then measured to determine the current flow.

General purpose multimeters employing internal current shunts are generally limited to ten amperes maximum because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact current measuring instrument that requires no internal fuse.

Clamp-on multimeters provide improved capability for measuring current over general purpose multimeters by employing an integral current clamp which senses the current in the current-carrying conductor without having to cut the current-carrying conductor or break the circuit including the current-carrying conductor. A current clamp is typically provided in the same housing with a multimeter which measures other parameters such as voltage and resistance in the conventional manner using separate test probes. The current clamp is closed around the current-carrying conductor, which may include copper wires and buss bars, to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured has largely been eliminated. Likewise, the internal fuse has been eliminated in clamp-on multimeters.

In order to obtain a valid current measurement, the magnetic core in the current clamp must completely encircle the current-carrying conductor so that the current clamp is completely closed. The current clamp must be mechanically actuated to open the jaws, the current-carrying conductor inserted, and the jaws then closed around the current-carrying conductor. In tight physical spaces such as an electrical cabinet, inserting the clamp-on multimeter and using this technique to make a current measurement is inconvenient and difficult. Moreover, the jaws must be aligned to complete the magnetic core for obtaining a valid current measurement. Clamp-on multimeters are therefore difficult to use in confined spaces and require a large physical space in which to open the jaws of the current clamp.

Clamp-on multimeters also tend to be physically heavy because of the substantial amount of iron used on the magnetic core. Furthermore, high levels of current may saturate the magnetic core. The current measuring capacity of the clamp-on multimeter is accordingly limited to current levels that do not saturate the magnetic core.

DETAILED DESCRIPTION

Specific details of embodiments according to the present disclosure are described below with reference to electrical circuits including a conductor. Other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1-4.

Figure 1:
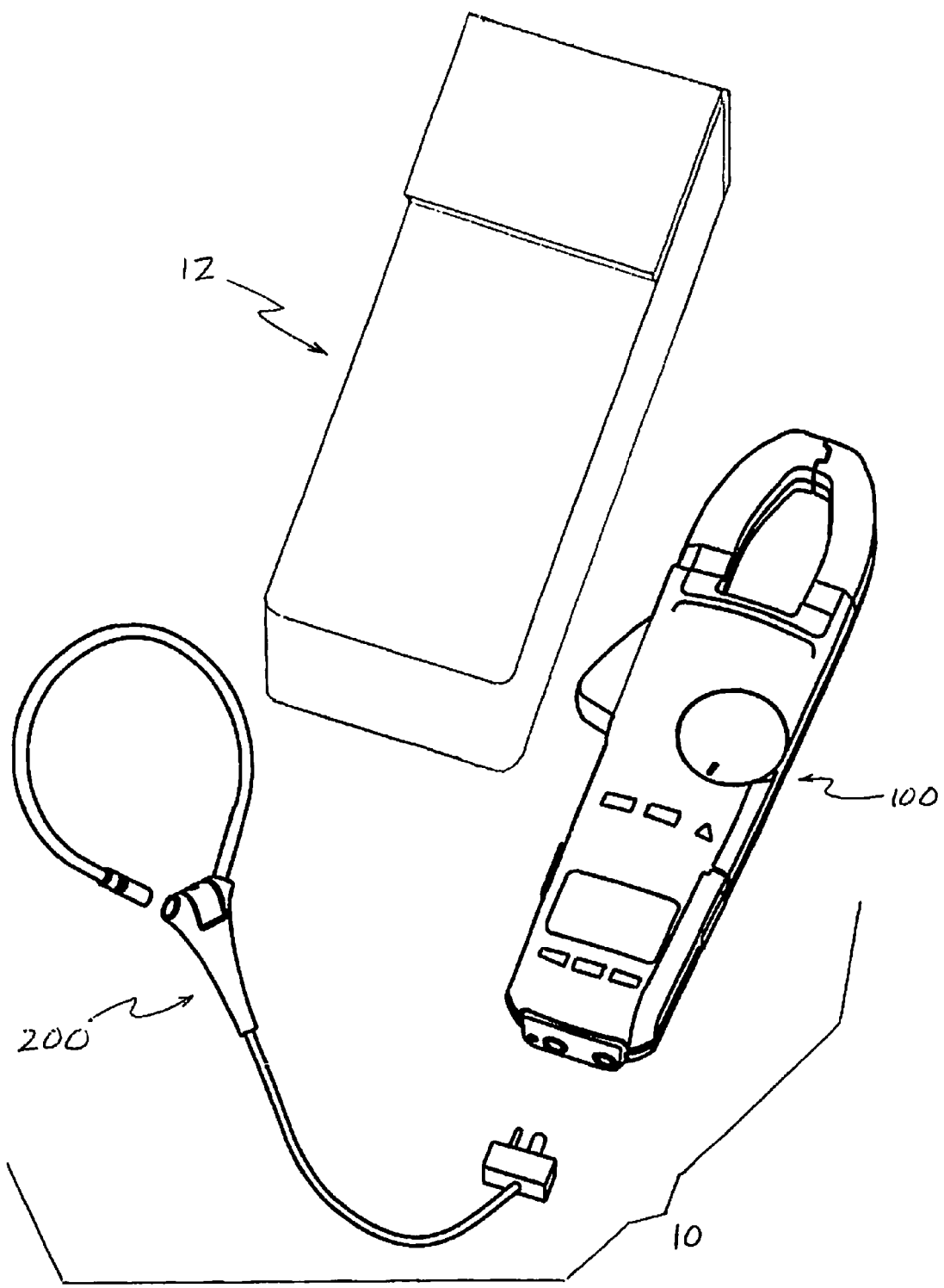
FIG. 1 is an exploded view of a kit according to an embodiment of the present disclosure for measuring alternating current.

FIG. 1 is an exploded view of a kit 10 for measuring alternating current. The kit 10 includes a multimeter 100, a Rogowski coil 200, and a carrying case 12. The multimeter 100 and the Rogowski coil 200 are shown extracted from the carrying case 12 in FIG. 1. The multimeter 100 and/or the Rogowski coil 200 may also be inserted into the carrying case 12 such that the kit 10 may transported as a single unit (not shown).

Figure 2:
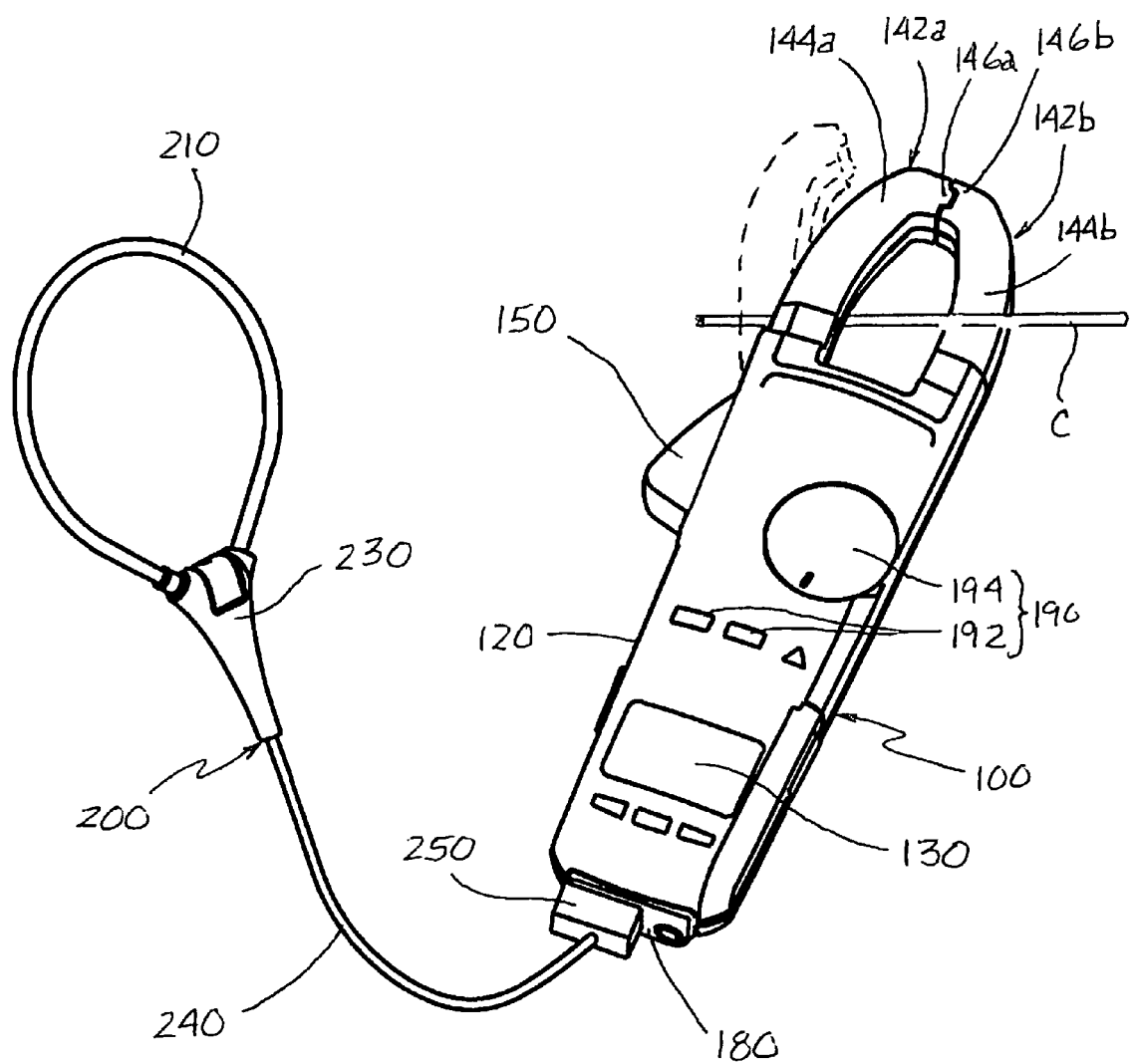
FIG. 2 is a schematic illustration of a multimeter with a Rogowski coil according to an embodiment of the present disclosure for measuring alternating current.
Figure 3:
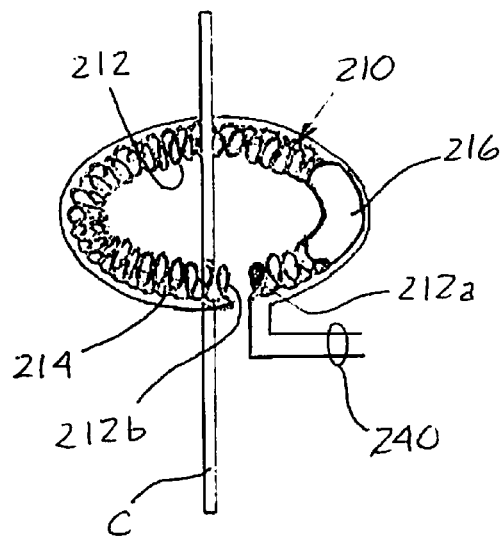
FIG. 3 is a schematic illustration of components of a Rogowski coil according to an embodiment of the present disclosure.

FIG. 2 is a schematic illustration of the multimeter 100 coupled to the Rogowski coil 200. The multimeter 100 includes a housing 120 having a slender shape whereby a user (not shown) is able to comfortably hold the housing 120.

A clamp 140 is provided on the housing 120. The clamp 140 includes a pair of clamp portions 142a and 142b having cores 144a and 144b, respectively. The clamp cores 144a and 144b can include windings (not shown) around a core made of a magnetizable material, e.g., iron. The first clamp portion 142a is movably attached, e.g., pivotally attached, to the housing 120 and capable of moving to an arrangement shown with one-dot-chain lines. The second clamp portion 142b can be fixed with respect to the housing 120. The clamp portions 142a and 142b include ends 146a and 146b, respectively, and are accordingly capable of being positioned in an open arrangement with the ends 146a and 146b separated by a gap. The clamp portions 142a and 142b are also capable of being positioned in a closed arrangement with the ends 146a and 146b being contiguously engaged. Thus, the closed arrangement of the clamp 140 shown in solid lines in FIG. 2 has an approximately ring-like shape. A lever 150 fixed to the first clamp portion 142a can be used to move the first clamp portion 142a relative to the second clamp portion 142b and/or the housing 120. The clamp 140 is configured to inductively sense a flow of alternating current in a conductor C surrounded by the clamp 140 in the closed arrangement. The clamp 140 may include a Hall effect current sensor (not shown) for, e.g., sensing a direct current flow in the conductor C. The clamp 140 can sense the flow of current without breaking an electrical circuit (not shown in FIG. 2) that includes the conductor C. The clamp 140 may produce a first signal in a first voltage range corresponding to the current flow.

The housing 120 includes a port 180, e.g., three socket terminals are shown in FIG. 1, for sensing other electrical parameters. Plugs on the ends of lead wires (not shown) may be connected to the port 180 to introduce to the multimeter 100 various signals that indicate voltage, resistance and/or temperature.

The housing can include a display 130, for example, a liquid crystal display (LCD). The display 130 shows measured parameters such alternating current or alternating current frequencies that are inductively sensed by the clamp 140. In particular, a signal is induced in the clamp 140 by a flow of current in the conductor C that is surrounded by the clamp 140. The display 130 also shows the electrical parameters sensed by signals received via the port 180, including those produced by the Rogowski coil 200.

The housing 120 includes one or more selectors 190, e.g., push-buttons 192 and/or a rotary switch 194. The selectors 190 may turn on and off a power source (not shown) for the multimeter 100 and/or change the measuring modes of the multimeter 100. For example, the rotary switch 194 can be turned to select a mode for measuring alternating current with the clamp 140. Other modes for measuring voltage, resistance, temperature, etc. can be selected with the selectors 190. According to embodiments of the present disclosure, the selectors 190 can also be used to select a mode for measuring alternating current with the Rogowski coil 200.

The Rogowski coil 200 includes a loop 210, a pendant 230, a signal cable 240, and a coupler 250. Additionally referring to FIG. 3, the loop 210 includes a toroidal coil 212 wound around a flexible, non-magnetic core 214 and sheathed in a flexible covering 216. According to one embodiment of the present disclosure, the non-magnetic core 214 includes air. The covering 216 can be sufficiently rigid to protect the form of the toroidal coil 212 and still be sufficiently flexible to allow the loop 210 to be adjusted in length and/or shape. The length of the loop 210 can be adjusted with the pendant 230. A start turn of the toroidal coil 212a and an end turn of the toroidal coil 212b are electrically connected by the signal cable 240 to the coupler 250 (FIG. 2). The coupler 250 can include an arrangement for electrically coupling and decoupling the Rogowski coil 200 with respect to the multimeter 100. For example, the coupler 250 can include one or more plugs arranged to cooperatively engage one or more socket terminals of the port 180.

The clamp 140 and the Rogowski coil 200 are both able to sense alternating current flowing through a conductor surrounded by the clamp 140 or the loop 210. There are, however, a number of differences between the Rogowski coil 200 and the clamp 140. For example, the loop 210 is more flexible and has a smaller cross-section than the substantially rigid clamp portions 142a and 142. The Rogowski coil 200 can accordingly be used in confined spaces that are too tight and/or too small for the clamp 140. Further, the loop 210 can be reshaped to surround conductors having cross-sections that the clamp 140 cannot close around. Another difference is the greater current measuring capability of the Rogowski coil 200 as compared to the clamp 140. Specifically, an air core does not become saturated at levels of current that saturate the magnetic material of the cores 144a and 144b. Yet another difference is the Rogowski coil 200 is spaced from the multimeter 100 by the signal cable 240 whereas the relative position of the clamp 140 is fixed with respect to the multimeter 100. Thus, the clamp 140 and the multimeter 100 can be handled as a single unit whereas the Rogowski coil 200 allows the user to position the display 130 in an orientation that is convenient for viewing.

Figure 4:
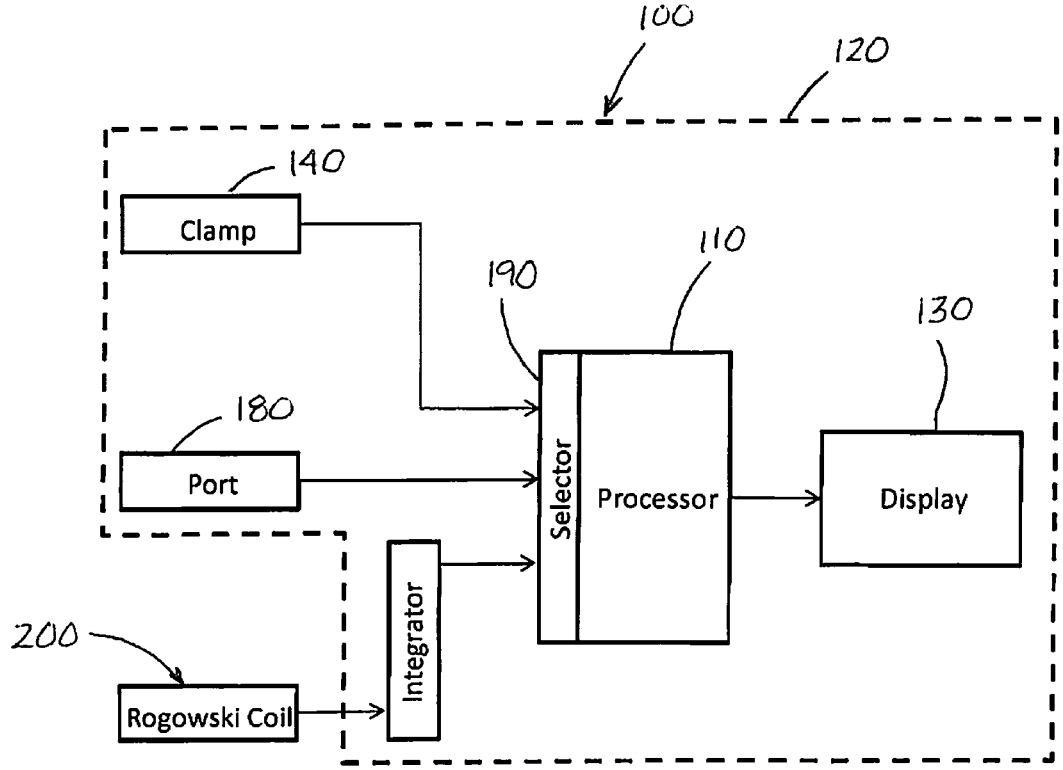
FIG. 4 is a block diagram of components of a multimeter according to an embodiment of the present disclosure.

FIG. 4 is a block diagram of components of the multimeter 100 according to an embodiment of the present disclosure. The multimeter 100 includes the display 130, the clamp 140, the port 180, the selectors 190 and a processor 110. The clamp 140 includes a winding that inductively senses alternating current without breaking the electrical circuit and produces a first signal in a first voltage range corresponding to the alternating current. For example, the first voltage range may be measured in terms of millivolts. The first signal is received by the processor 110 which outputs a signal to the display 130. Similarly, other signals from the port 180 are also received by the processor 110. According to certain embodiments, the selector 190 selects the signal(s) that the processor 110 uses to present the desired measurements on the display 130. The Rogowski coil 200 inductively senses alternating current without breaking the electrical circuit and produces a second signal in a second voltage range corresponding to the alternating current. For example, the second voltage range may be measured in terms of microvolts. The multimeter 100 also includes an integrator 112 to scale the second signal from the Rogowski coil 200 to the first voltage range, e.g., to scale a microvolt output of the Rogowski coil 200 up to a millivolt signal that the processor 110 can process. The housing 120 of the multimeter 100 includes the processor 110, the integrator 112, the display 130, the clamp 140, the port 180, and the selectors 190. According to certain embodiments, only the Rogowski coil 200 is separable from the housing 120.

Specific details of the embodiments of the present disclosure are set forth in the description and in the figures to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the present disclosure.

Unless the context clearly requires otherwise, throughout the description and the claims, the words "comprise", "comprising", and the like are to be construed in an inclusive sense, as opposed to an exclusive or exhaustive sense; that is to say, in the sense of including, but not limited to. Additionally, the words "herein", "above", "below", and words of similar connotation, when used in the present disclosure, shall refer to the present disclosure as a whole and not to any particular portions of the present disclosure. Where the context permits, words in the above Detailed Description using the singular or plural number may also include the plural or singular number respectively. The word "or", in reference to a list of two or more items, covers all of the following interpretations of the word: any of the items in the list, all of the items in the list, and any combination of the items in the list.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A clamp-on multimeter for measuring alternating current flow in an electrical conductor of an electrical circuit, comprising:
   a digital display configured to show a measurement of the alternating current flow in the electrical conductor;
   a housing including the digital display;
   a first sensor having a magnetizable material core configured to inductively sense the alternating current without breaking the electrical circuit, the first sensor includes a first clamp portion fixedly coupled to the housing and a second clamp portion pivotally coupled to the first clamp portion, wherein the electrical conductor passes through a gap between the first and second clamp portions in an open arrangement of the first sensor and the first and second clamp portions surround the electrical conductor in a closed arrangement of the first sensor;
   a second sensor including a Rogowski coil having a non-magnetic core and configured to inductively sense the alternating current without breaking the electrical circuit;
   a processor disposed in the housing and configured to receive an input signal in a first voltage range and to send an output signal to the digital display; and
   an integrator disposed in the housing and configured to scale a signal from the second sensor in a second voltage range to the first voltage range;
   wherein the housing includes the processor, the integrator, and a selector configured to select the input signal to the processor from one of (a) the first sensor and (b) the integrator.

2. The clamp-on multimeter of claim 1, wherein the housing includes a port configured to electrically couple and decouple the second sensor relative to the integrator.

3. A clamp-on multimeter for measuring alternating current flow in an electrical conductor of an electrical circuit, comprising:
   a digital display configured to show a measurement of the alternating current flow in the electrical conductor;
   a housing including the digital display;
   a first sensor having a magnetizable material core configured to inductively sense the alternating current without breaking the electrical circuit, the first sensor includes a first clamp portion fixedly coupled to the housing and a second clamp portion pivotally coupled to the first clamp portion, wherein the electrical conductor passes through a gap between the first and second clamp portions in an open arrangement of the first sensor and the first and second clamp portions surround the electrical conductor in a closed arrangement of the first sensor;
   a processor disposed in the housing and configured to receive an input signal in a first voltage range and to send an output signal to the digital display; and
   a port configured to electrically couple a Rogowski coil with the processor;
   wherein the housing includes the processor, the port, and a selector configured to select the input signal to the processor from one of (a) the first sensor and (b) the port.

4. The clamp-on multimeter of claim 3, further comprising an integrator electrically coupling the port to the processor, wherein the integrator is disposed in the housing and configured to scale a signal from the Rogowski coil in a second voltage range to the first voltage range.

5. A multimeter for measuring alternating current flow in an electrical conductor of an electrical circuit, comprising:
   a first sensor configured to inductively sense the alternating current without breaking the electrical circuit to generate a first signal, wherein the first sensor has a magnetizable material core;
   a second sensor configured to inductively sense the alternating current without breaking the electrical circuit to generate a second signal, wherein the second sensor has a non-magnetic core; and
   a selector configured to select the first sensor or the second sensor as an input to the multimeter for measuring the alternating current.

6. The multimeter of claim 5 wherein the first sensor comprises a clamp movable between an open arrangement and a closed arrangement, the open arrangement is configured to pass the electrical conductor through a gap between first and second clamp portions, and the closed arrangement is configured to close the gap and thereby surround the electrical conductor with the first and second clamp portions.

7. The multimeter of claim 6 wherein the first and second clamp portions include the magnetizable material core.

8. The multimeter of claim 5 wherein the second sensor comprises a Rogowski coil.

9. The multimeter of claim 5 wherein the second sensor comprises a toroidal coil wound around a non-magnetic material core.

10. The multimeter of claim 5 wherein the first sensor produces the first signal in a first voltage range and the second sensor produces the second signal in a second voltage range, and the multimeter further comprises:
   a display configured to show a measurement of the alternating current flow in the electrical conductor;
   a processor configured to receive an input signal in the first voltage range and to send an output signal to the display;
   an integrator configured to scale the second signal from the second voltage range to the first voltage range; and
   a housing including the display, the processor and the integrator.

11. The multimeter of claim 10 wherein the first voltage range is greater than the second voltage range by a factor of approximately $10^3$.

12. The multimeter of claim 10 wherein the first sensor comprises a clamp including a first clamp portion fixedly coupled to the housing and a second clamp portion pivotally coupled to the first clamp portion.

13. The multimeter of claim 5, wherein the first sensor is configured to sense a direct current without breaking the electrical circuit.

14. The multimeter of claim 5, wherein the first sensor includes a Hall effect sensor.

15. A kit for measuring alternating current flow in an electrical conductor of an electrical circuit, comprising:
   a multimeter including—
      a digital display configured to show a measurement of the alternating current flow in the electrical conductor;
      a clamp having a magnetizable material core configured to inductively sense the alternating current without breaking the electrical circuit and to produce a first signal in a first voltage range corresponding to the alternating current, the clamp includes a first clamp portion and a second clamp portion pivotally coupled to the first clamp portion, wherein the electrical conductor passes through a gap between the first and second clamp portions in an open arrangement of the clamp and the first and second clamp portions surround the electrical conductor in a closed arrangement of the clamp;

a processor configured to receive an input signal in the first voltage range and to send an output signal to the digital display; and an integrator configured to scale a second signal in a second voltage range to the first voltage range;

wherein the housing includes the display, the processor, the integrator, and a port configured to receive the second signal; and a Rogowski coil having a non-magnetic core and configured to inductively sense the alternating current without breaking the electrical circuit and to produce the second signal in the second voltage range corresponding to the alternating current.

16. The kit of claim 15, wherein the Rogowski coil includes a mating feature configured to couple and decouple with the port.

17. The kit of claim 15 further comprising a carrying case configured to receive the multimeter and the Rogowski coil.

* * * * *